(12) United States Patent
Oda

(10) Patent No.: US 10,096,923 B2
(45) Date of Patent: Oct. 9, 2018

(54) ELECTRIC CONTACT AND SOCKET FOR ELECTRIC PARTS

(71) Applicant: ENPLAS CORPORATION, Kawaguchi-shi, Saitama (JP)

(72) Inventor: Takahiro Oda, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 171 days.

(21) Appl. No.: 14/405,974

(22) PCT Filed: May 28, 2013

(86) PCT No.: PCT/JP2013/064708
§ 371 (c)(1),
(2) Date: Dec. 5, 2014

(87) PCT Pub. No.: WO2013/183484
PCT Pub. Date: Dec. 12, 2013

(65) Prior Publication Data
US 2015/0126081 A1    May 7, 2015

(30) Foreign Application Priority Data

Jun. 6, 2012 (JP) ................................ 2012-128666

(51) Int. Cl.
*B32B 15/01* (2006.01)
*H01R 13/03* (2006.01)
(Continued)

(52) U.S. Cl.
CPC ............ *H01R 13/03* (2013.01); *B23K 35/26* (2013.01); *B23K 35/262* (2013.01);
(Continued)

(58) Field of Classification Search
None
See application file for complete search history.

(56) References Cited

U.S. PATENT DOCUMENTS 4,314,848 A * 2/1982 Todoroki .................. C22C 5/06
200/266
4,529,667 A * 7/1985 Shiga .................... B32B 15/018
205/170
(Continued)

FOREIGN PATENT DOCUMENTS

EP         2139012 A1   12/2009
WO    WO 2007/034921 A1    3/2007

OTHER PUBLICATIONS

International Search Report (Form PCT/ISA/210) dated Aug. 27, 2013 in corresponding International Application No. PCT/JP/2013/064708 (2 pages) (1 page English Translation).
(Continued)

*Primary Examiner* — Seth Dumbris
(74) *Attorney, Agent, or Firm* — Staas & Halsey LLP

(57) ABSTRACT

An electric contact for preventing a terminal of an electric part and the electric contact from sticking to each other after a continuity test to improve the durability of the electric contact; and a socket for electric parts using the electric contact. The electric contact of this invention includes a first layer made from a material into which Sn melts and diffuses upon application of heat; and a second layer formed on the outer side of the first layer and made from a material lower in the rate at which Sn melts and diffuses upon application of heat than the first layer.

12 Claims, 12 Drawing Sheets

(51) Int. Cl.
    *B23K 35/26*     (2006.01)
    *C22C 13/00*     (2006.01)
    *H01R 12/70*     (2011.01)
    *H01R 13/24*     (2006.01)
    *G01R 3/00*     (2006.01)
    *G01R 1/067*     (2006.01)

(52) U.S. Cl.
    CPC ............ *B32B 15/018* (2013.01); *C22C 13/00* (2013.01); *H01R 12/7082* (2013.01); *G01R 1/06722* (2013.01); *G01R 3/00* (2013.01); *H01R 13/2421* (2013.01); *Y10T 428/12708* (2015.01); *Y10T 428/12715* (2015.01); *Y10T 428/12875* (2015.01); *Y10T 428/12896* (2015.01); *Y10T 428/12944* (2015.01)

(56) References Cited

U.S. PATENT DOCUMENTS

| | | | | |
|---|---|---|---|---|
| 5,139,891 A | * | 8/1992 | Cowie | C22C 5/04 420/463 |
| 5,849,424 A | * | 12/1998 | Sugawara | C22F 1/08 148/536 |
| 5,876,862 A | * | 3/1999 | Shibuya | H01H 1/023 200/266 |
| 6,150,041 A | * | 11/2000 | Lautzenhiser | B32B 15/013 257/211 |
| 6,352,634 B1 | * | 3/2002 | Forderer | B23K 35/007 205/170 |
| 2008/0139058 A1 | | 6/2008 | Oda et al. | |
| 2010/0163276 A1 | * | 7/2010 | Yamaguchi | H01H 1/021 174/126.2 |
| 2011/0291686 A1 | | 12/2011 | Oda et al. | |

OTHER PUBLICATIONS

PCT Written Opinion, Form PCT/ISA/237, dated Aug. 27, 2013 in corresponding International Application No. PCT/JP2013/064708 (3 pages).

Written Opinion and Search Report dated Jan. 26, 2016 in corresponding Singapore Patent Application No. 11201408151X (8 pages).

Extended European Search Report dated Apr. 26, 2016 in related European Patent Application No. 13801082.2 (8 pages).

Written Opinion dated Oct. 10, 2016 in related Singaporean Patent Application No. 11201408151X (5 pages).

Chapter 5: Diffusion Nov. 11, 2011; [Retrieved from the Internet] <URL: http://web.archive.org/web/20110901000000*/http://www.physics.uwo.ca/~lgonchar/courses/p2800/Chapter5_Diffusion_Handouts.pdf> (13 pages).

* cited by examiner

FIG.10
(a) 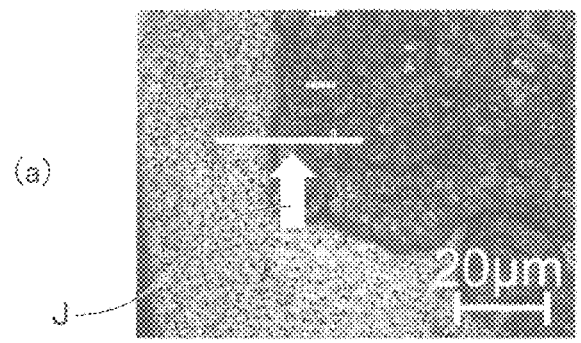
(b) 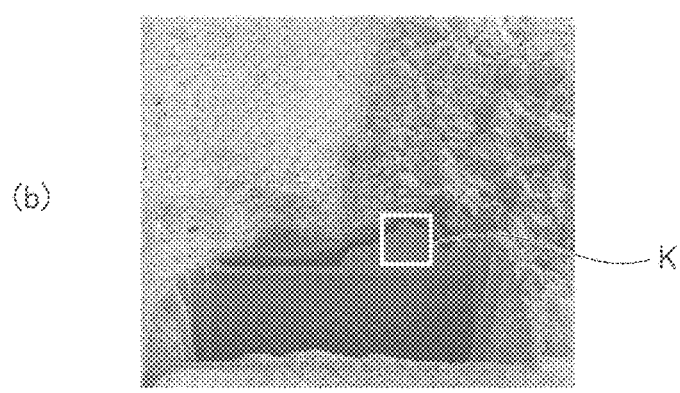
(c) 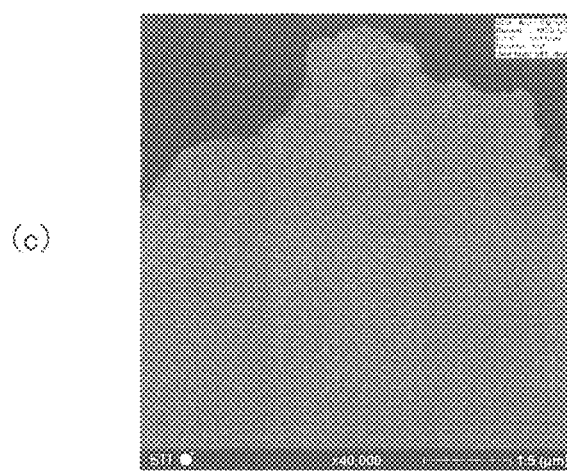

FIG.12
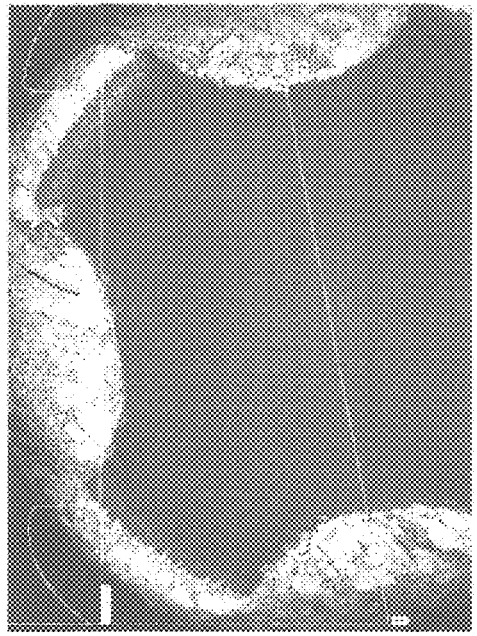 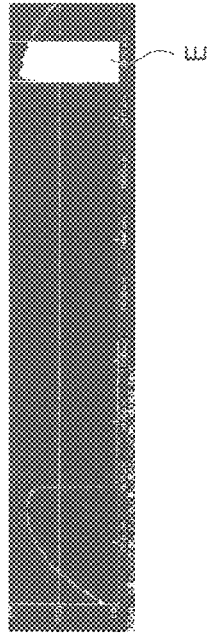
Pd-Ag ALLOY BASE MATERIAL ALONE
(a)
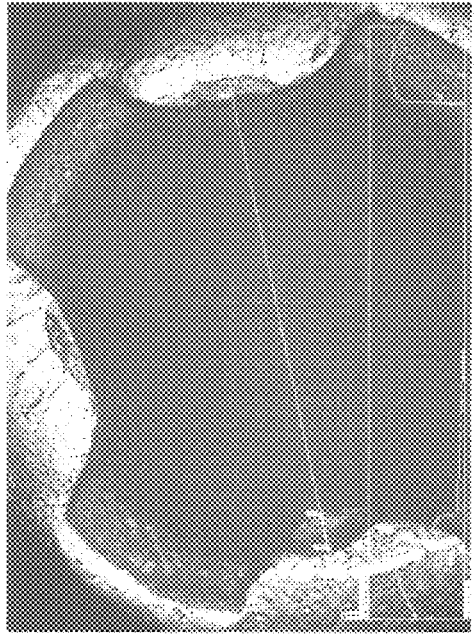 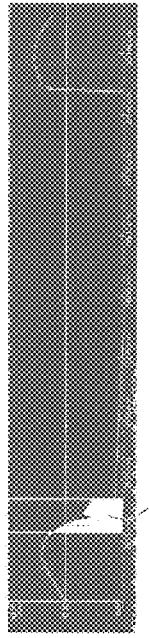
Ag/Pd-Ag LAMINATED STRUCTURE
(b)

ELECTRIC CONTACT AND SOCKET FOR ELECTRIC PARTS

CROSS REFERENCE TO RELATED APPLICATIONS

This application is a U.S. National Stage Application under 35 U.S.C. 371 of International Patent Application No. PCT/JP2013/064708, filed May 28, 2013, which is based on and claims foreign priority benefit of Japanese Patent Application No. 2012-128666, filed Jun. 6, 2012, in the Japanese Patent Office, the entire disclosures of which are herein incorporated by reference as a part of this application.

TECHNICAL FIELD

The present invention relates to an electric contact electrically connected to an electric part such as a semiconductor device (hereinafter referred to as "IC package"), and a socket for electric parts in which this electric contact is disposed.

BACKGROUND ART

Conventionally, probe pins arranged in an IC socket for use as a socket for electric parts have beer known as this type of electric contacts. This IC socket is disposed on a wiring board and configured to house an IC package which is an inspection object. Terminals of this IC package are electrically connected to electrodes of the wiring board through the probe pins.

The probe pins have a structure in which a foundation layer and a surface layer are formed on a base material. On the other hand, some of the terminals of the IC package are formed from so-called lead-free solder not containing lead and composed primarily of tin. These probe pint and terminals are electrically connected to each other as the result of being brought into contact with each other to conduct a continuity test (see, for example, Patent Literature 1).

CITATION LIST

Patent Literature

Patent Literature 1: Japanese Domestic Re-publication No. 2007/034923.

SUMMARY OF INVENTION

Technical Problem

In such a conventional probe pin as described above, however, a terminal of the IC package sticks to the probe pin in some cases when the IC package is detached from the IC socket after a continuity test is conducted, thus making it difficult to detach the IC package. If the terminal of the IC package is unstuck under this condition, the leading end of the probe pin is liable to become damaged. Thus there arises the problem of degrading the durability of the probe pin. This sticking is remarkable, in particular, after a continuity test is conducted at high temperature (for example, 150° C. or higher) and is, therefore, significantly problematic.

Hence, it is an object of the present invention to provide an electric contact (e.g. probe pin) and a socket for electric parts capable of preventing a terminal of an electric part (e.g. IC package) and the electric contact from sticking to each other after a continuity test and thereby improving the durability of the probe pin.

Solution to Problem

As the result of keen examination in order to achieve such an object, the inventors of the present invention have found the following. That is, when heat is applied with a terminal of an electric part and an electric contact placed in contact with each other in a continuity test, tin which is the material of the terminals of the electric part melts and diffuses into the material of the electric contact to form an alloy. It has turned out that if the rate at which tin melts and diffuses is too fast at that time, sticking between the terminal of the electric part and the electric contact occurs due to drastic alloy formation. On the other hand, if the tin which is the material of the terminals of the electric part does not melt and diffuse into the material of the electric contact, a portion of the tin adherent to the electric contact is liable to become oxidized to form an insulator, thus causing the problem of impeding electrical connection. From these considerations, the inventors have found that allowing the tin which is the material of the terminals of the electric part to melt and diffuse into the material of the electric contact at an adequate rate to forms an alloy prevents stinking between the terminal of the electric part and the electric contact, while ensuring electrical connection between the terminal of tin electric part and the electric contact, and improves the durability of the electric contact and the socket tot electric parts.

Hence, an electric contact according to the present invention includes a first layer into which Sn melts and diffuses upon, application of heat; and a second layer formed on the outer side of the first layer and lower in the rate at which Sn melts and diffuses upon application of heat than the first layer.

Preferably, the electric contact of the present invention is further provided with a base material having electrical conductivity and a foundation layer formed on the outer side of the base material and composed primarily of Ni, the first layer is formed on the outer side of the foundation, layer, and the second layer is formed on the outer side of the first layer.

Preferably, the electric contact of the present invention is provided with a base material serving as the first layer, and the second layer is formed on the outer side of the base material.

In the electric contact of the present invention, the second layer is preferably an Ag layer or an Ag alloy layer.

In the electric contact of the present invention, the second layer is preferably an Ag plated layer or an Ag alloy plated layer containing Au, Cu, Pd or Sn in addition to Ag, the weight ratio of the Au, Cu, Pd or Sn is lower than that of the Ag.

In the electric contact of the present invention, the first layer is preferably a Pd layer or a Pd alloy layer.

In the electric contact of the present invention, the first layer is preferably a Pd plated layer or a Pd alloy plated layer containing Ag, Au, Cu or Sn in addition to Pd, the weight ratio of Ag, Au, Cu or Sn is lower than the Pd.

In the electric contact of the present invention, the first layer is preferably a Pd layer having a thickness of 0.1 μm or greater but no greater than 5 μm, and the second layer is preferably an Ag layer baring a thickness of 0.1 μm or greater but no greater than 20 μm.

A socket for electric parts according to the present invention includes a socket body; a housing portion in which an electric part provided with an Sn-containing terminal is housed; and an electric contract disposed in the socket body and placed in contact with the terminal, wherein a first layer into which Sn melts and diffuses upon application of heat and a second layer lower in the rate at which Sn melts and diffuses upon application of heat than the first layer are formed on a surface of the electric contact.

Advantageous Effects of Invention

Since an electric contact in accordance with the present invention includes a first layer into which Sn melts and diffuses upon application of heat, and a second layer formed on the outer side of the first layer and lower in the rate at which Sn melts and diffuses upon application of heat than the first layer, it is possible to prevent sticking between the terminal of the electric part and the electric contact after a continuity test, while ensuring electrical connection between the terminal of the electric part and the electric contact, and therefore, improve the durability of the electric contact.

In the electric contact of the present invention, the first and second layers can be formed on a surface of a base material with excellent adhesion by forming an Ni foundation layer on the outer side of the base material and forming the first and second layers on the outer side of the Ni foundation layer.

In the electric contact of the present invention, a process for manufacturing the electric contact can be simplified to reduce manufacturing costs by using the base material as the first layer and forming the second layer on the outer side of the base material.

In the electric contact of the present invention, a second layer sufficiently low in the rate at which Sn melts during heating can be obtained by forming the second layer as an Ag layer or an Ag alloy layer.

In the electric contact of the present invention, a second layer sufficiently low in the rate at which Sn melts during heating can be obtained by forming the second layer as an Ag plated layer or an Ag alloy plated layer containing Au, Cu, Pd or Sn in addition to Ag, the weight ratio of the Au, Cu, Pd or Sn is lower than that of the Ag.

In the electric contact of the present invention, a first layer into which Sn melts during heating can be obtained by forming the first layer as a Pd layer or a Pd alloy layer.

In the electric contact of the present invention, a first layer into which Sn melts during heating can be obtained by forming the first layer as a Pd plated layer or an Pd alloy plated layer containing Ag, Au, Cu, or Pn in addition to Pd, the weight ratio of Ag, Au, Cu or Sn is lower than the Pd.

In the electric contact of the present invention, the rate at which Sn melts into the second layer can be made lower than the rate at which Sn melts into the first layer by forming the first layer as a Pd layer having a thickness of 0.1 μm or greater but so greater than 5 μm and forming the second layer as an Ag layer having a thickness of 0.1 μm or greater but no greater than 20 μm.

According to a socket for electric parts of the present invention, it is possible to prevent sticking between the terminal of the electric part and the electric contact, and therefore, improve the durability of the socket for electric parts.

BRIEF DESCRIPTION OF DRAWINGS

FIG. 10, (a) is an enlarged view of the H part of FIG. 9(c), (b) is a cross-sectional view of the J part of FIGS. 10(a), and (c) is an enlarged view of the K part of FIG. 10(b).

FIG. 12 is a drawing of a probe pin according to Embodiment 3 of the present invention; illustrating the results of a comparative experiment on edge breakdown in the contacting portion of the probe pin due to sticking.

DESCRIPTION OF EMBODIMENTS

Hereinafter, embodiments of the present invention will be described.

Embodiment 1 of Invention

FIGS. 1 to 8 illustrate Embodiment 1 of the present invention.

Figure 1:
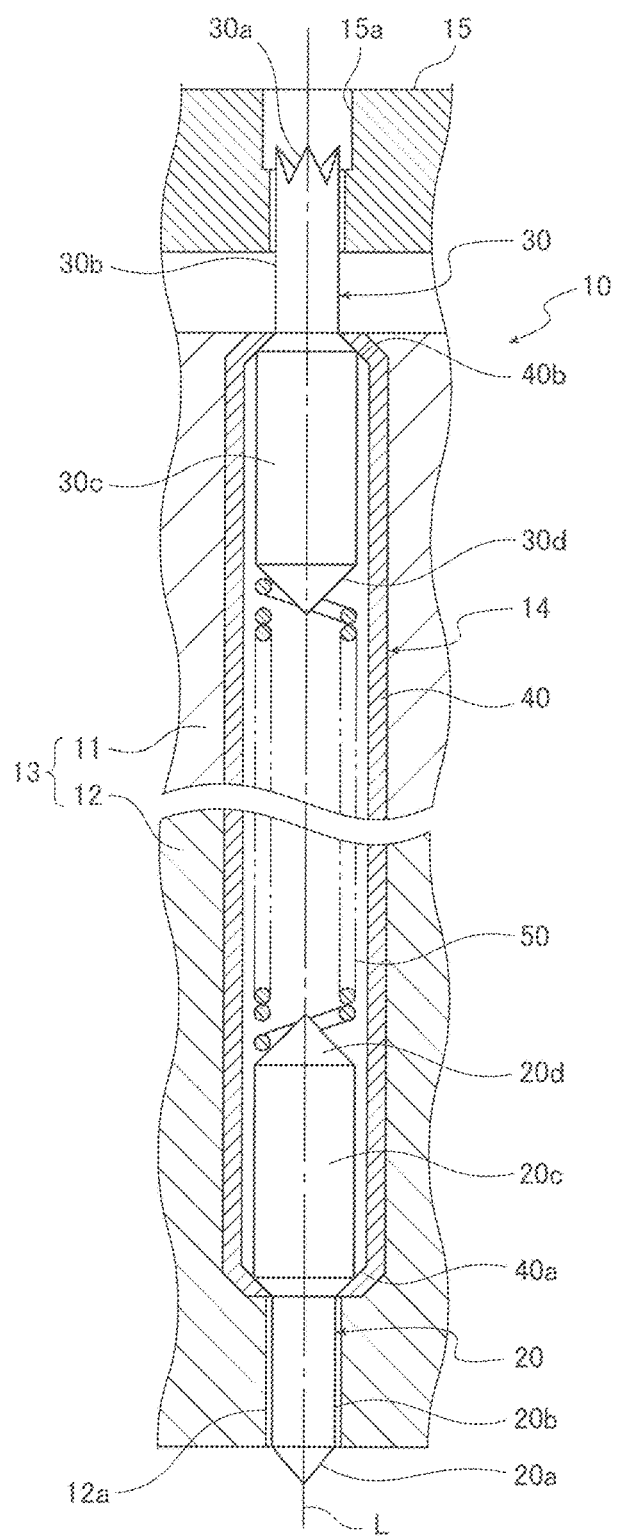
FIG. 1 is an enlarged cross-sectional view of the vicinity of a probe pin in an IC socket according to Embodiment 1 of the present invention.
Figure 2:
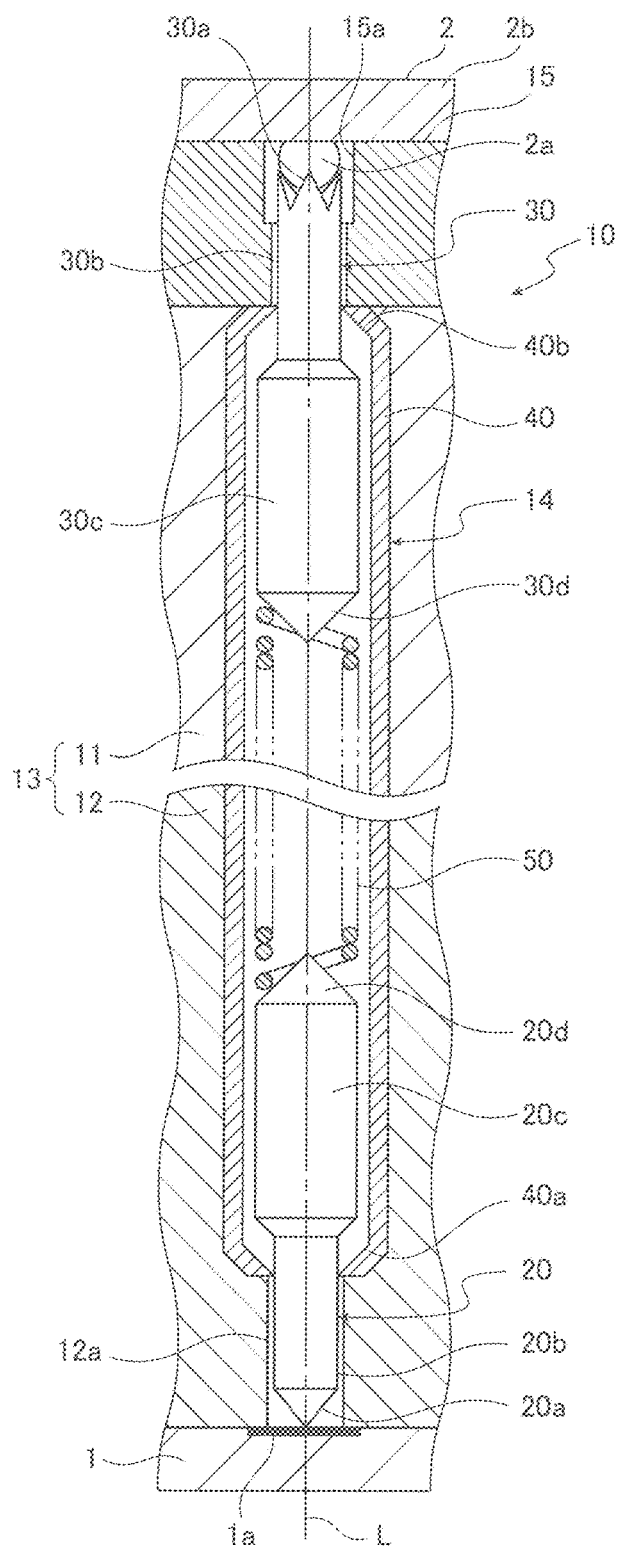
FIG. 2 is an enlarged cross-sectional view illustrating a state of an IC package and a wiring board being attached to the IC socket of FIG. 1.

As illustrated in FIGS. 1 and 2, an IC socket 10 serving as "socket for electric parts" of this Embodiment 1 is configured to be fined on a wiring board 1 and fitted with an IC package 2 serving as "electric part" and placed on the upper portion of the IC socket, so as to electrically connect an electrode 1a of the wiring hoard 1 and a solder ball 2a serving as a "terminal" of the IC package 2. The IC socket 10 is used in, for example, testing apparatus for continuity tests, such as burn-in tests, on the IC package 2.

In the IC package 2 of this Embodiment 1, a plurality of solder balls 2a is disposed on the bottom surface of a substantially rectangular package body 2b. These solder balls 2a are formed from so-called, lead-free colder composed primarily of Sn and not containing lead.

The IC socket 10 is provided with a socket body 13 including an upper plate 11 and a lower plate 12, and a plurality of probe pins 14 serving as "electric contacts" disposed in this socket body 13 into a matrix-like shape, so as to penetrate through the socket body is in the longitudinal direction thereof. The socket body 13 is positioned in place on the wiring board 1 by positioning pine (not illustrated) with the upper plate 11 and the lower plate 12 fined with fixing screws (not illustrated). Note that a floating plate 15 serving as "housing portion" movable up and down with the IC package 2 housed is disposed on the upper plate 11.

In this Embodiment 1, the layout pitch of the solder balls 2a of the IC package 2 is the same as the layout pitch of the electrodes 1a of the wiring board 1 electrically connected to the solder balls 2a. The layout pitch of the probe pins 14 is also the same as these layout pitches.

As illustrated in FIGS. 1 and 2, each probe pin 14 includes, along a lengthwise axis line L, a first plunger 20 including a contacting portion 20a to have electrical contact with the electrode 1a of the wiring board 1 at the leading end of the first plunger 20, a second plunger 30 including a contacting portion 30a to have electrical contact with the solder ball 2a of the IC package 2 at the leading end of the second plunger 30, and a cylindrical member 40 disposed continuously between the first plunger 20 and the second plunger 30. A coil spring 50 for urging the first plunger 20 and the second plunger 30 in directions in which the plungers move away from each other along the axis line L is housed inside this cylindrical member 40.

The first plunger 20 is provided with a protruding portion 20b at the leading end of which the substantially conical contacting portion 20a to hare contact with the electrode 1a of the wiring board 1 is disposed; and an insertion portion 20c thicker than the protruding portion 20b. The insertion portion 20c of these portions is slidably housed inside the cylindrical member 40 in a state of having contact therewith. The movement of the first plunger 20 in the projecting direction (downward direction) thereof is restricted by a locking part 40a formed at the lower end of the cylindrical member 40. In addition, a receiving portion 20d for stopping the coil spring 50 is formed into a conical shape with the axis line L in the center at an end of the insertion portion 20c and integrally therewith. Yet additionally, the protruding portion 20b is slidably inserted through a through-hole 12a of the lower plate 12.

The second plunger 30 is provided with a protruding portion. 30b at the leading end of which a substantially crown-shaped contacting portion 30a to have contact with the solder ball 2a of the IC package 2 is disposed; and an insert ion portion 30c thicker than the protruding portion 30b. The insertion portion 30c of these portions is housed inside the cylindrical member 40 in a state of slidably having contact therewith. The movement of the second plunger 30 in the projecting direction (upward direction) thereof is restricted by a locking part 40b formed at the upper end of the cylindrical member 40. In addition, a receiving portion 30d for stopping the coil spring 50 is formed, into a conical shape with the axis line L in the center at the end of the insertion, portion 30c and integrally therewith. Yet additionally, the protruding portion 30b projects out of the upper plate 11, and the contacting portion 30a is slidably inserted through a through-hole 15a of the floating plate 15 capable of housing the solder ball 2a of the IC package 2.

Next, the material of the probe pin 14 in this Embodiment 1 will be described using FIGS. 3 to 8. Note that a description will be made of the material of the second plunger 30 of the probe pin 14 in particular here.

Figure 3:
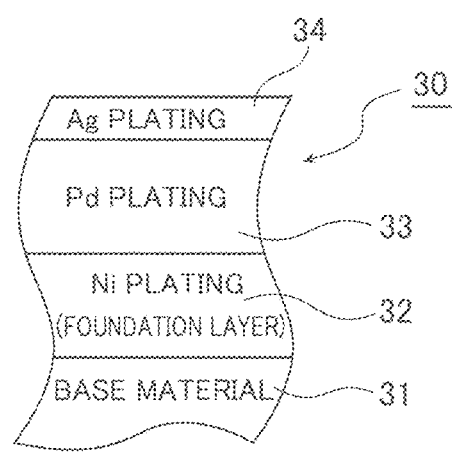
FIG. 3 is as enlarged schematic cross-sectional view illustrating the contacting portion of the probe pin according to Embodiment 1.

As illustrated in FIG. 3, the second plunger 30 of the probe pin 14 in this Embodiment 1 has a structure in which a base material 31, a foundation layer 32, a first surface layer 33 serving as "first layer", and a second layer 34 serving as "second layer" are laminated. Among the material and the layers, the base material 31 is formed from a material having electrical conductivity, i.e., a Be—Cu (beryllium-copper) alloy here. The foundation layer 32 is formed by means of 2 to 3 μm-thick, Ni plating. Note that the base material 31 and the foundation layer 32 may be formed from another appropriate material.

In addition, the first surface layer 33 is formed from a material, i.e., a Pd plated layer here, into which Sn melts and diffuses upon application of heat. A thickness of the first surface layer 33 of 0.1 μm or greater makes available the function of allowing Sn to melt and diffuse into the layer. More preferably, the thickness is 0.2 μm or greater for Sn to melt and diffuse over a prolonged period of time. Too thick a first surface layer 33 is liable to suffer from the problem of, for example, becoming cracked, and therefore, the layer is preferably 5 μm or less in thickness. Note that the first surface layer 33 may be formed from a material other than Pd alone, as long as Sn melts and diffuses into the material at a predetermined rate upon application of heat. For example, the first surface layer 33 may be made of one of Pd alloy layers higher in the weight ratio of Pd and containing Ag, Au, Cu or Sn. Examples of these Pd alloy layers include Pd—Ag layer, a Pd—Sn layer, a Pd—Au layer, a Pd—Ag—Co layer, and a Pd—Ag—Sn layer, each being higher in the weight ratio of Pd. Among Pd alloys, a Pd—Co (cobalt) alloy and a Pd—Ni alloy are not suited for the first surface layer 33, however.

This Pd plated layer is formed using, for example, a process of manufacture by wet plating or a process of manufacture by ion plating.

In the process of manufacture by wet plating, 2 to 3 μm-thick Ni plating is performed to form the foundation layer 32. Au strike plating is performed to form as adhesion layer on the foundation layer 32, and then Pd plating is performed to superpose the first surface layer 33 on the adhesion layer. Note that as described above, one of Pd alloys higher in the weight ratio of Pd and containing Ag, Au, Cu or Sn (for example, Pd—Ag, Pd—Sn, Pd—Au, Pd—Ag—Cu and Pd—Ag—Sn higher in the weight ratio of Pd) may be plated, in addition to plating with Pd alone, to form the first surface layer 33.

In the process of manufacture by ion plating, 2 to 3 μm-thick Ni plating is performed to form the foundation layer 32, and Pd is deposited on the foundation layer 32 by ion plating as the first surface layer 33. Note that as described above, Ag, Au, Cu or Sn may be deposited, in addition to Pd alone, as the first surface layer 33, with Pd being higher in the weight ratio (examples of this process includes depositing Pd and Ag, Pd and Sn, Pd and Au, Pd, Ag and Cu, and Pd, Ag and Sn, with Pd being higher in the weight ratio).

The second surface layer 34 is such that Sn melts and diffuses thereinto upon application of heat, and is formed from a material, i.e., an Ag plated layer here, lower in diffusion rate than the first surface layer 33. A thickness of the second surface layer 34 of 0.1 μm or greater can retard Sn diffusion into the first surface layer 33. More preferably, the thickness is 0.3 μm or greater, in order for the second surface layer 34 to also function accordingly at 150° C. or higher. Even more preferably, the thickness is 1 μm or greater, in order for the second surface layer 34 to also function accordingly at 180° C. or higher. Too thick a second surface layer 34 lowers a feed rate in a hoop plating apparatus, and is therefore liable to cause the problem of drying halfway through a process. Accordingly the thickness is preferably 20 μm or less. Still more preferably, the thickness is 10 μm or less, in order to avoid affecting the dimensions of fitting between the IC socket 10 and the probe pin 14. This Ag layer is formed on the first surface layer 33 using a process of manufacture by wet plating or a process of manufacture by ion plating, in the same way as is the above-described process for manufacturing the first surface layer 33. Note that the second surface layer 34 may be formed from a material other than Ag alone, as long as Sn melts and diffuses into the material at a predetermined rate lower than the rate of the first surface layer 33 upon application of heat. For example, the second surface layer 34 may be made of one of Ag alloy layers higher in the weight ratio of Pd and containing Au, Cu, Pd or Sn. Examples of these Ag alloy layers include an Ag—Sn layer, an Ag—Au layer, an Ag—Cu layer and an Ag—Pd layer, each being higher in the weight ratio of Ag.

When the IC socket 10 provided with the probe pin 14 insisting the second plunger 30 and configured as described above is used, each of a plurality of probe pins 14 is attached to the socket body 13, the contacting portion 20a of the first plunger 20 is projected downward, and the contacting portion 30a of the second plunger 30 is disposed in a state of facing the through-hole 15a of the floating plate 15, as illustrated in FIG. 1. Then, this IC socket 10 is positioned and fixed on the wiring board 1, and the contacting portion 20a of the first plunger 20 is placed in contact with the electrode 1a of the wiring board 1, as illustrated in FIG. 2. At this time, the coil spring 50 is compressed by the receiving portion 20d of the insertion portion 20c of the first plunger 20 inside the cylindrical member 40.

Thereafter, the IC package 2 is housed in the floating plate 15, and the adder ball 2a is fitted in the through-hole 15a. When the floating plate 15 is brought down under that condition, the contacting portion 30a of the second plunger 30 comes into contact with the solder ball 2a. If the floating plate 15 is brought down further, the coil spring 50 is compressed inside the cylindrical member 40 by the receiving portion 30b of the insertion portion 30c of the second plunger 30.

The coil spring 50 is compressed by the first plunger 20 and the second plunger 30 in this way to urge the contacting portion 20a of the first plunger 20 and the contacting portion 30a of the second plunger 30 by the coil spring 50 in directions in which the contacting portions move away from each other, thereby bringing the electrode 1a of the wiring board 1 and the solder ball 2a of the IC package 2 into contact with each other. Under this condition, a continuity test, such as a burn-in test, is conducted on the IC package 2.

As the result of connecting a continuity test as described above, the solder ball 2a of the IC package 2 and the second plunger 30 of the probe pin 14 used to stick to each other when the IC package 2 is detached from the IC socket 10 after the continuity test. In this Embodiment 1, however, it is possible to prevent the solder ball 2a and the second plunger 30 from sticking to each other, while ensuring electrical connection between the solder ball 2a and the second plunger 30, and thereby improve the durability of the probe pin 14 and the IC socket 10.

That is, only the surface layer 33 which is a plated layer of Pd or a Pd alloy composed primarily of Pd, i.e., a material into which Sn melts and diffuses at a comparatively high rate upon application of heat for burn-in environments (for example, 125° C. to 180° C.), is conventionally provided on the second plunger 30 of the probe pin 14. Accordingly, when a continuity test is conducted on an IC package 2 including lead-free solder terminals (solder balls 2a), Sn in a solder ball 2a melts comparatively fast into a probe pin 14 to drastically form a large amount of Sn—Pd alloy, thus causing the problem of the solder ball 2a and the probe pin 14 sticking to each other through this drastically-formed Sn—Pd alloy after the continuity test. If an attempt is made to forcibly unstick the solder ball 2a and the probe pin 14 from each other under such a condition, a large amount of solder remains on the surface layer 33 of the probe pin 14. Consequently, the surface layer 33 of the probe pin 14 becomes damaged, thus degrading the durability of the probe pin 14.

In the second plunger 30 of the probe pin 14, the first surface layer 33 is made of a plated layer of Pd or a Pd alloy composed primarily of Pd which is a material into which Sn melts and diffuses at a comparatively high rate upon application of heat. In this Embodiment 1, however, the probe pin 14 is provided with the second surface layer 34 formed using a plated layer of Ag or an alloy composed primarily of Ag which is a material lower in the rate of diffusion than the first surface layer 33, and therefore, the rate at which Sn in the solder ball 2a melts into the probe pin 14 lowers. As a result, an Ag—Sn alloy or an Sn—Pd alloy is formed not drastically but gradually. Consequently, after a continuity test, it is possible to prevent the problem of the solder ball 2a and the probe pin 14 from sticking to each other through the Ag—Sn or Sn—Pd alloy thus formed.

Sn in the solder ball 2a of the IC package 2 more easily diffuses into Pd or the like particularly in a high-temperature environment (for example, 150° C. to 180° C.), among burn-in environments (for example, 125° C. to 180° C.). Even in such a case, it is possible to suppress the rate at which Sn melts and diffuses by interposing, between the two metals, a layer made from a material, such as Ag or an Ag alloy, into which Sn melts and diffuses upon application of heat but which is lower in the rate of diffusion. Thus, it is possible to prevent the problem of the solder ball 2a and the probe pin 14 sticking to each other.

Consequently, any large amount of solder is less likely to remain on the surface layer of the probe pin 14 after a continuity test. Therefore, the surface layer of the probe pin 14 is less likely to become damaged, thus improving the durability of the probe pin 14.

On the other hand, if Sn in the solder ball 2a does not melt and diffuse into the material of the second plunger 30, a portion of Sn adherent to the probe pin 14 is liable to become oxidized to form an insulator, thus impeding electrical connection. In this Embodiment 1, however, the probe pin 14 includes, between the solder ball 2a and the Pd layer, a layer formed from a material, such as Ag, which allows Sn to melt and diffuse into the material of the second plunger 30 at an adequate rate to form an alloy. Consequently, it is possible to prevent sticking between the solder ball 2a and the second plunger 30 as described above, while ensuring electrical connection between the solder ball 2a and the second plunger 30.

Figure 4:
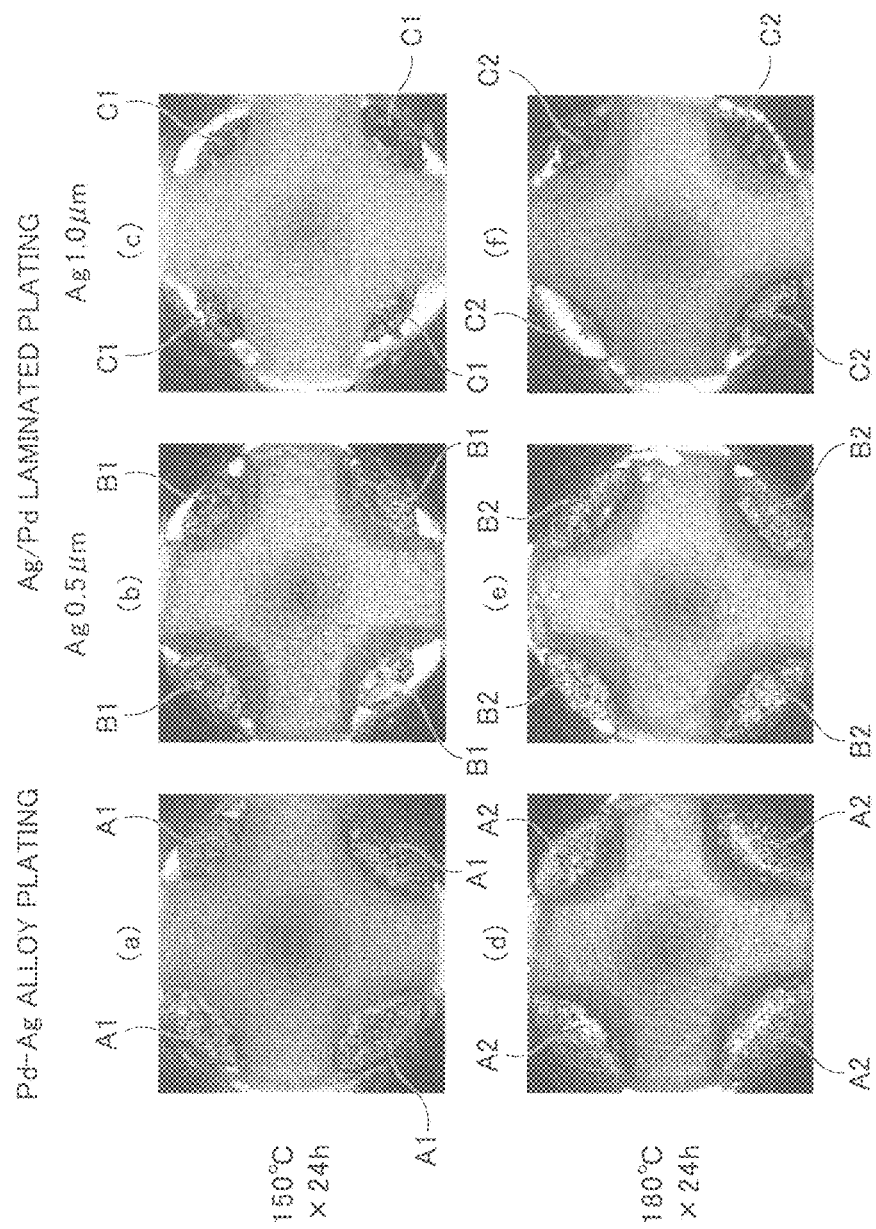
FIG. 4 is a plan view of the probe pin according to Embodiment 1, illustrating the results of a comparative experiment on solder sticking.

Next, a first evaluation test that confirms the advantageous effects of the present invention will be described using FIG. 4.

Here, the amount of solder in the solder ball of the IC package formed into an alloy and adhered to the probe pin after a high-temperature test was compared between a probe pin of Embodiment 1 of the present invention provided with a second plunger in which a second surface layer which was an Ag plated layer was laminated on the outer side of a first surface layer which was a Pd placed layer and a conventional probe pin provided with a second plunger including a surface layer which was a Pd—Ag alloy plated layer on the outer side of the second plunger.

(1) Test Contents

A simultaneous high-temperature test was conducted using two types of IC sockets including a probe pin having the above-described configuration of Embodiment 1 (configuration in which the Ag plated second surface layer was laminated on the outer side of the Pd plated first surface) and one type of IC socket including a probe pin having a configuration in which a change was made in the probe pin from the lamination of the first surface layer and the second surface layer of the second plunger to a single Pd—Ag alloy plated layer.

The specifications of the probe pins and the solder balls of IC packages used in this test are as follows. Note that in this specification, a configuration in which an (A) layer is laminated on the outer side of a (B) layer is described as "(A)/(B)".

(2) Specifications of Two Types (Practical Examples) of Probe Pins Including Ag/Pd Plated Laminated Layer Both probe pins use Be—Cu for the base material thereof.

The contacting portions or both probe pins are formed into a substantially crown-like shape as the contacting portion 30a illustrated in FIG. 1.

The below-described laminated layers were formed on these contacting portions by wet plating.

That is, 2 to 3 µm-thick Ni plating was performed, and Au strike plating was performed to form an adhesion layer on the outer side of the Ni layer. For the first type of probe pin, there were laminated a 0.5 µm-thick first surface layer formed by Pd plating and a 0.5 µm-thick second surface layer formed by Ag plating. For the second type of probe pin, there were laminated a 0.5 µm-thick first surface layer formed by Pd plating and a 1.0 µm-thick second surface layer formed by Ag plating.

(3) Specifications of One Type (Conventional Example) of Probe Pin Including Ag—Pd Alloy Plated Layer The probe pin uses Be—Cu for the base material thereof.

The contacting portion of the probe pin is formed into a substantially crown-like shape as the contacting portion 30a illustrated in FIG. 1.

The below-described layer was formed on this contacting portion by wet plating.

That is, 2 to 3 µm-thick Ni plating was performed, and Au strike plating was performed to form an adhesion layer on the outer side of the Ni layer. Subsequently, a 0.5 µm-thick Pd plating layer and a 0.1 µm-thick Ag plated layer were alternately laminated, and then Pd and Ag were thermally diffused at predetermined temperature in a thermostatic chamber to form an Ag—Pd alloy layer.

(4) Specifications of Solder Balls of IC Package
Sn-3Ag-0.5Cu (5) Test Method

Method for measuring the amount of adhered solder: The Test was conducted using a laser microscope VK-9500 made by Keyence Corporation.

Test Conditions 1
Ambient temperature: Room temperature to 150° C.
Test time: 24 hours
Test cycle 1
a. Attach the IC package to the IC socket.
b. Raise the temperature up to 150° C.
c. Keep the temperature at 150° C. for 24 hours.
d. Lower the temperature down to room temperature.
e. Detach the IC package from the IC socket.
f. Measure the amount of solder adhered so the contacting portion of the probe pin.

Test Conditions 2
Ambient temperature: Room temperature to 180° C.
Test time: 24 hours
Test Cycle 2
a. Attach the IC package to the IC socket.
b. Raise the temperature up to 180° C.
c. Keep the temperature at 180° C. for 24 hours.
d. Lower the temperature down to room temperature.
e. Detach the IC package from the IC socket.
f. Measure the amount of solder adhered to the contacting portion of the probe pin.

(6) Test Results

The above-described test was conducted to analyze the contenting portion of each probe pin.

In the test conducted according to the test conditions 1 and the test cycle 1 (150° C.×24 hours), there was obtained the result that the amount of adhered solder was large in the conventional probe pin including a Pd—Ag alloy plated layer, as observed in part A1 shown in FIG. 4(a), whereas the amount of adhered solder was small in the probe pin of Embodiment 1 of the present invention including an Ag(0.5 µm)/Pd(0.5 µm) plated laminated layer, as observed in part B1 shown in FIG. 4(b). In addition, there was obtained the result that the amount of adhered solder in the probe pin of Embodiment 1 of the present invention including an Ag(1.0 µm)/Pd(0.5 µm) plated laminated layer was even smaller, as observed in part C1 shown in FIG. 4(c).

In the test conducted according to the test conditions 2 and the test cycle 2 (180° C.×24 hours), there was obtained the result that the amount of adhered solder was large in the conventional probe pin including a Pd—Ag alloy plated layer, as observed, in part A2 shown in FIG. 4(d), whereas the amount of adhered solder was small in the probe pin of Embodiment 1 of the present invention including an Ag(0.5 µm)/Pd(0.5 µm) plated laminated layer, as observed in part B2 shown in FIG. 4(e). In addition, there was obtained the result that the amount of adhered solder in the probe pin of Embodiment 1 of the present invention including an Ag(1.0 µm)/Pd(0.5 µm) plated laminated layer was even smaller, as observed in part C2 shown in FIG. 4(f).

From these results, there was drawn the conclusion that it could be said that in the probe pin of Embodiment 1 of the present invention including an Ac/Pd plated laminated layer, a solder ball and the probe pin were less likely to stick to each other under the temperature condition of 150° C. to 180° C., when compared with the conventional probe pin including a Pd—Ag alloy plated layer.

Next, a second evaluation test that confirms the advantageous effects of the present invention will be described using FIG. 5.

Here, the amount of solder is the solder ball of the IC package formed into an alloy and adhered to the probe pin with respect to the number of tests after a high-temperature test was conducted a plurality of times was compared between a probe pin of Embodiment 1 of the present invention and a conventional probe pin. As described above, the probe pin of Embodiment 1 of the present invention is provided with a second plunger in which a second surface layer which was an Ag plated layer was laminated on the outer side of a first surface layer which was a Pd plated layer. On the other hand, as described above, the conventional probe pin is provided with a second plunger including a surface layer which was a Pd—Ag alloy plated layer on the outer side of the second plunger.

(1) Test Contents

A simultaneous high-temperature test was conducted a plurality of times using an IC socket including a probe pin having the above-described configuration of Embodiment 1 (configuration in which the Ag plated second surface layer was laminated on the outer side of the Pd plated first surface) and an IC socket including a probe pin having a configuration in which a change was made in the probe pin from the lamination the first surface layer and the second surface layer of the second plunger to a single Pd—Ag alloy plated layer.

The specifications of the probe pin and the solder balls of IC packages used in this test are as follows.

(2) Specifications of Probe Pin (Practical Example) Including Ag/Pd Plated Laminated Layer The probe pin uses Be—Cu for the base material thereof.

The contacting portion of the probe pin is formed into a substantially crown-like shape at the contacting portion 30a illustrated in FIG. 1.

The below-described laminated layer was formed on this contacting portion by wet plating.

That is 2 to 3 µm-thick Ni plating was performed, and Au strike plating was performed to form an adhesion layer on the outer side of the Ni layer. Then, there were laminated a 0.5 µm-thick first surface layer formed by Pd plating and a 0.5 µm-thick second surface layer formed by Ag plating.

(3) Specifications of Probe Pin (Conventional Example) Including Ag—Pd Plated Laminated Layer The probe pin uses Be—Cu for the base material thereof.

The contacting portion of the probe pin is formed into a substantially crown-like shape as the contacting portion 30a illustrated in FIG. 1.

The below-described laminated layer was formed on this contacting portion by wet plating.

That is, 2 to 3 µm-thick Ni plating was performed, and Au strike plating was performed to form an adhesion layer on the outer side or the Ni layer. Subsequently, a 0.5 µm-thick Pd plated layer and a 0.5 µm-thick Ag plated layer were alternately laminated, and then Pd and Ag were thermally diffused at predetermined temperature in a thermostatic chamber to form an Ag—Pd alloy layer.

(4) Specifications of Solder Balls of IC Package
Sn-3Ag-0.5Cu (5) Test Method

Method for measuring the amount of adhered solder: The Test was conducted using a laser microscope VK-9500 made by Keyence Corporation.

Test Conditions
Ambient temperature: Room temperature to 150° C.
Test time: 24 hours (240 hours in total)
Test Cycle
a. Attach the IC package to the IC socket.
b. Raise the temperature up to 150° C.
c. Keep the temperature at 150° C. for 24 hours.
d. Lower the temperature down to room temperature.
e. Detach the IC package from the IC socket.
f. Measure the amount of solder adhered to the contacting portion of the probe pin.
g. Repeat steps a to f ten times.

(6) Test Results

The above-described test was conducted to analyze the contacting portion of each probe pin.

Figure 5:
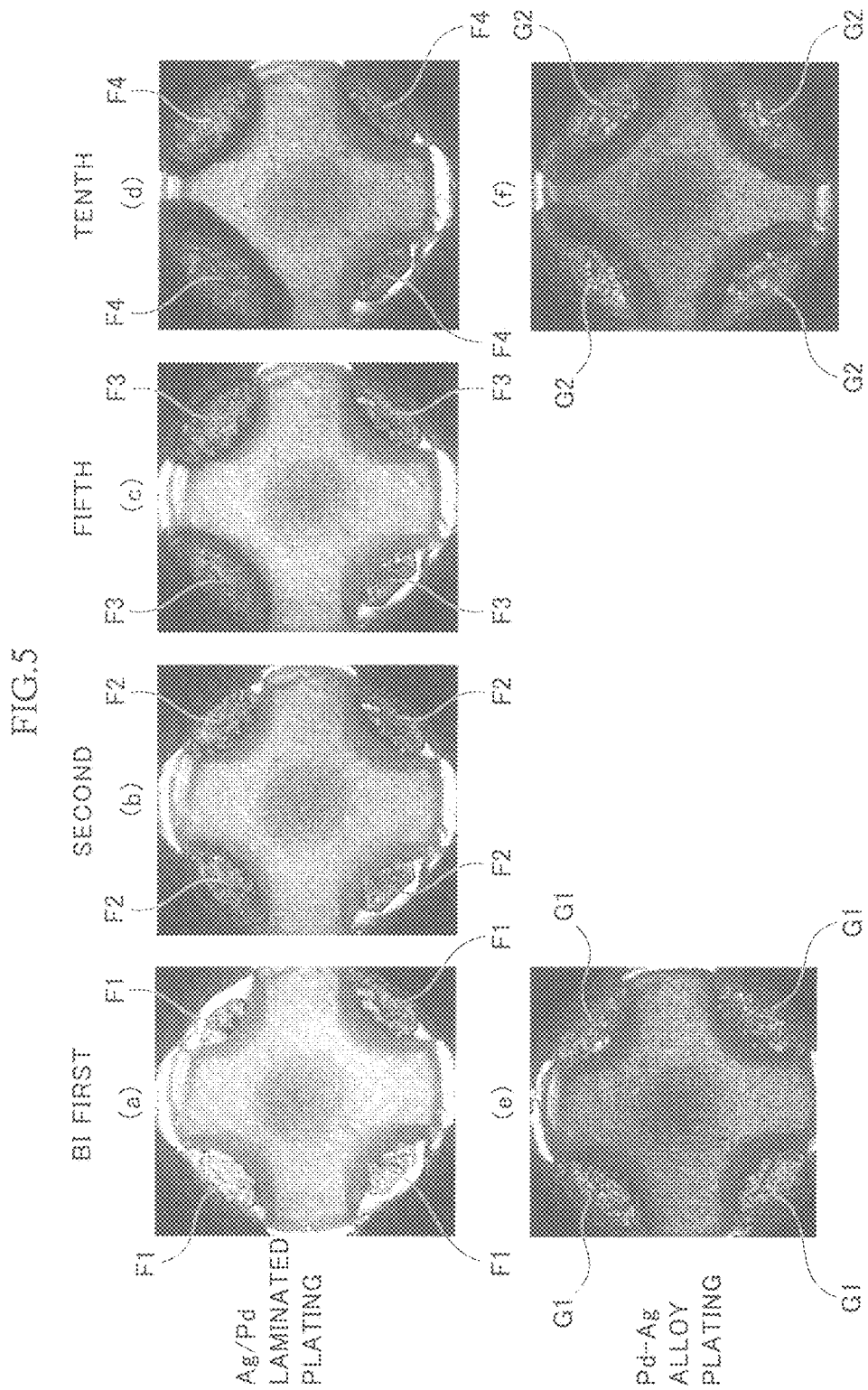
FIG. 5 is a plan view of the probe pin according to Embodiment 1, illustrating the results of a comparative experiment on the frequency of high-temperature testing and solder sticking.

There was obtained the result that the amount of adhered solder was small after a first high-temperature test and became gradually larger thereafter as the number of tests increased in the probe pin of Embodiment 1 of the present invention including an Ag/Pd plated laminated layer, as shown in the F1 part of FIG. 5(*a*) (subjected to a high-temperature test once), the F2 part of FIG. 5(*b*) (subjected to a high-temperature test twice), the F3 part of FIG. 5(*c*) (subjected to a high-temperature test five times), and the F4 part of FIG. 5(*d*) (subjected to a high-temperature test ten times). On the other hand, the amount of adhered solder was large already after a first high-temperature test in the conventional probe pin including, a Pd—Ag alloy plated layer, and showed almost no difference between the first and tenth tests, as shown in the G1 part of FIG. 5(*e*) (subjected to a high-temperature test once), and the G2 part of FIG. 5(*f*) (subjected to a high-temperature test ten times).

From these results, there was drawn the conclusion that it could be said that in the probe pin of Embodiment 1 of the present invention including an Ag/Pd plated laminated layer, it was possible to prevent an alloy from being drastically formed in the first test and consequently, a solder ball and the probe pin were less likely to stick to each other, when compared with the conventional probe pin including a Pd—Ag alloy plated layer.

Figure 6:
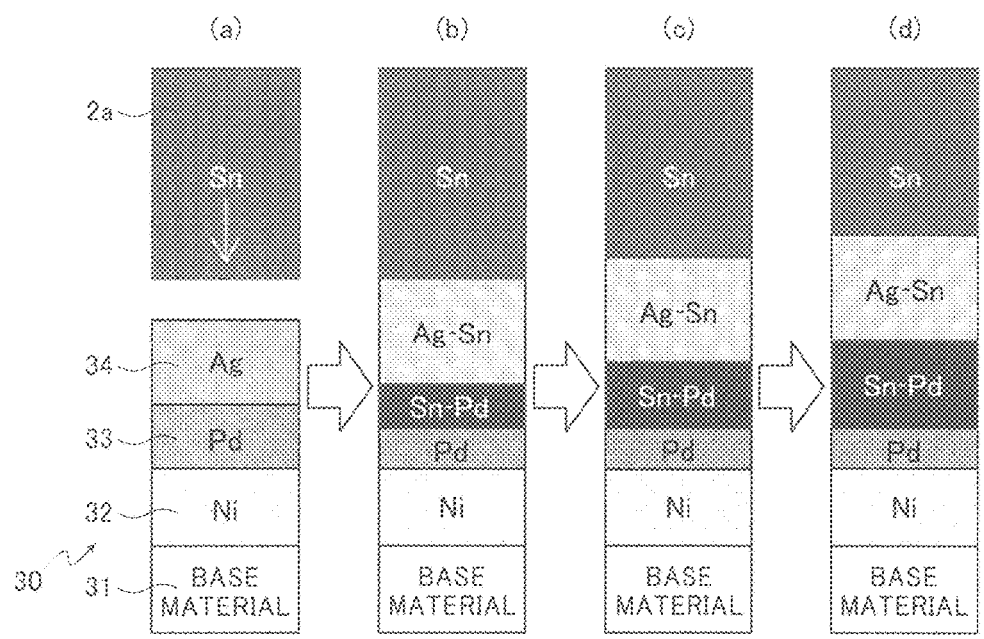
FIG. 6 is a schematic view of the probe pin according to Embodiment 1 used to describe the frequency of high-temperature testing and the state of solder sticking.
Figure 7:
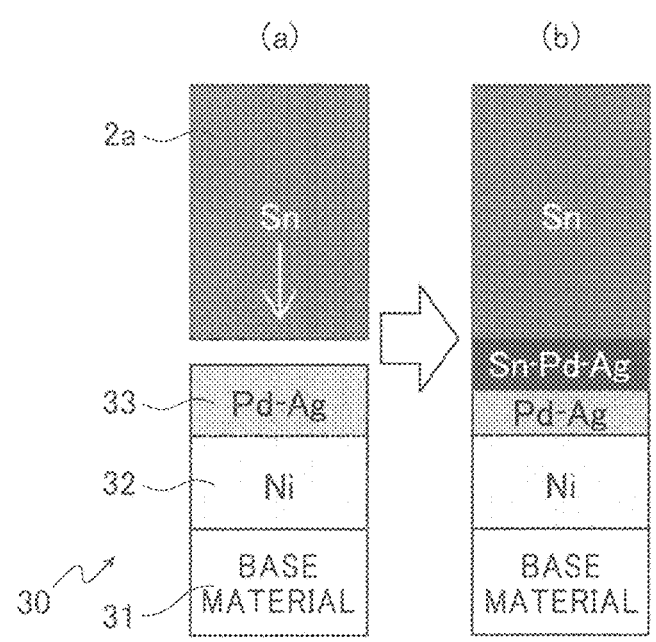
FIG. 7 is a schematic view of a conventional probe pin used to describe the state of solder sticking before and after high-temperature testing.
Figure 8:
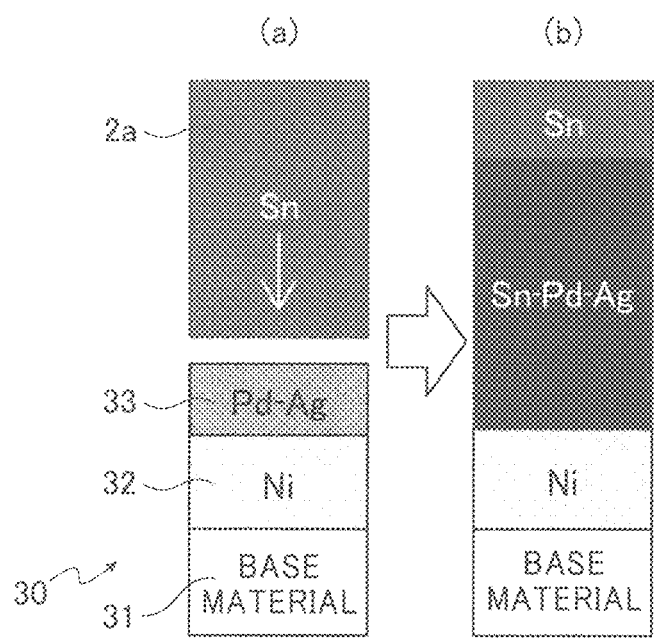
FIG. 8 is a schematic view of the conventional probe pin used to describe the state of solder sticking before and after high-temperature testing.

That is, in Embodiment 1 of the present invention, the probe pin 14 before a high-temperature test is in a state in which Ag in the second surface layer 34 is present between Sn in the solder ball 2a and Pd in the first surface layer 33 of the second plunger 30, as illustrated in FIG. 6(*a*). Accordingly, any Sn alloy is not formed drastically in the first high-temperature test. Instead, an Ag—Sn alloy and an Sn—Pd alloy are formed gradually after each test, in the order of the first high-temperature test shown in FIG. 6(*b*), the fifth high-temperature test shown in FIG. 6(*c*), and the tenth high-temperature test shown in FIG. 6(*d*). As a result, the solder ball 2a and the second plunger 30 of the probe pin 14 are less likely to stick to each other.

On the other hand, in the conventional probe pin including a Pd—Ag alloy plated surface layer alone, an Sn—Pd—Ag alloy, though not drastically formed in a high-temperature test at 125° C., is drastically formed in a high-temperature test as 150° C. or higher. That is, from FIG. 7(*a*) illustrating the state of the probe pin before a high-temperature test and FIG. 7(*b*) illustrating the state of the probe pin after a 125° C. high-temperature test is conducted once, it is understood that the formation of the alloy is not drastic in the 125° C. high-temperature test. On the other hand, from FIG. 8(*a*) illustrating the state of the probe pin before a high-temperature test and FIG. 8(*b*) illustrating the state of the probe pin after a 150° C. or higher high-temperature test is conducted once, it is understood that an Sn—Pd—Ag alloy is drastically formed in the 150° C. or higher high-temperature test in particular, even when a test is conducted only once. As a result, the solder ball 2a and the second plunger 30 of the probe pin 14 are liable to stick to each other.

Note that although the material of the second plunger 30 of the probe pin 14 has been discussed in this Embodiment 1, other locations of the probe pin 14 may be formed from the sane material.

Embodiment 2 of Invention

FIGS. 3 to 11 illustrate Embodiment 2 of the present invention. Note that Embodiment 2 of the present invention is the same as Embodiment 1 described above, except the constituent elements to be described hereinafter. Accordingly, constituent elements other than those different from the constituent elements of Embodiment 1 described above are denoted by like reference numerals and characters and will not be discussed again.

In this Embodiment 2, the material of the probe pin 14 in Embodiment 1 described above is applied to a blade spring-shaped contact pin including a plate-like contacting portion to have contact with a solder-plated lead.

Hereinafter, a description will be made of the material of a contact pin in this Embodiment 2. Note that the material of a plate-like contacting portion to have contact with the solder-plated lead of a contact pin will be described in particular here.

Like the second plunger 30 illustrated in FIG. 3, the contacting portion of a contact pin of this Embodiment 2 has a configuration in which a base material 31, a foundation layer 32, a first surface layer 33 serving as "first layer," and a second surface layer 34 serving as "second layer" are laminated. Note that details on the configuration and the like are the same as in Embodiment 1 described above, and therefore, will not be discussed again here.

Figure 11:
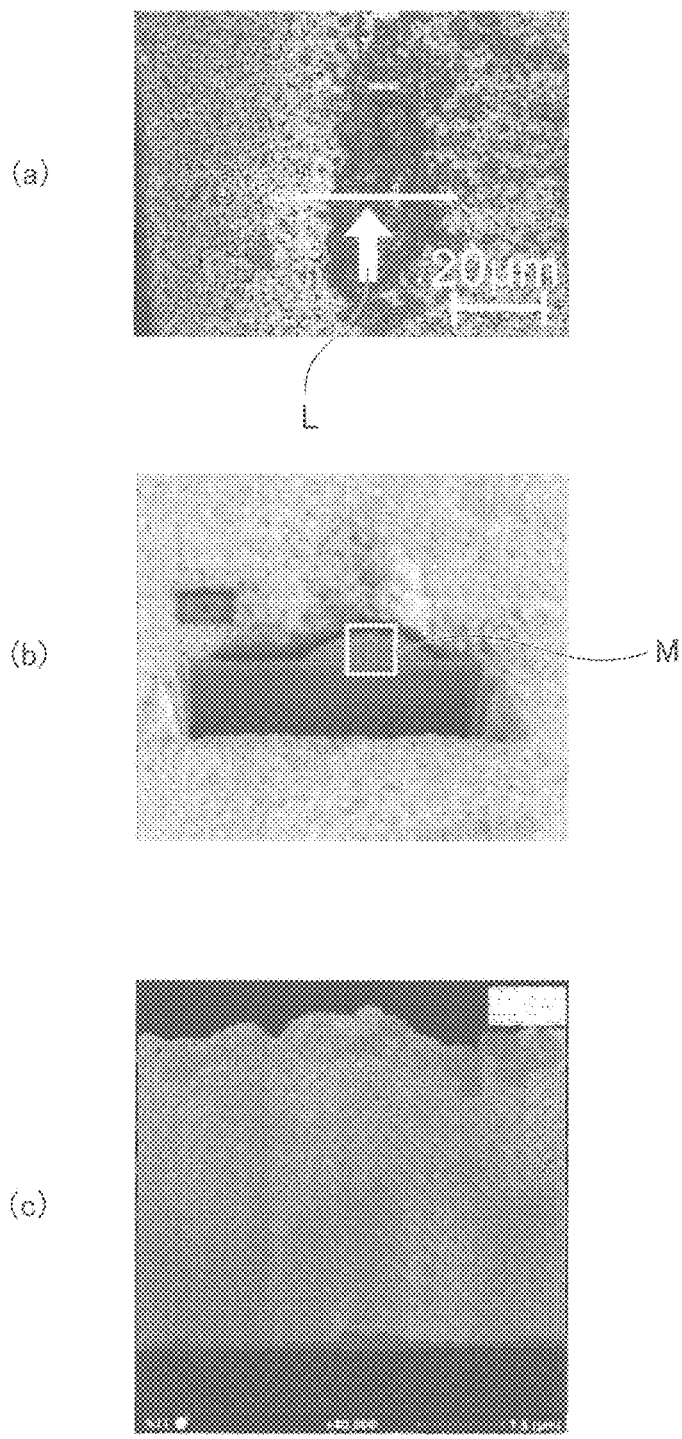
FIG. 11, (a) is an enlarged view of the I part of FIG. 9(e), (b) is a cross-sectional view of the L part of FIGS. 11(a), and (c) is an enlarged view of the M part of FIG. 11(b).

Next, a third evaluation test that confirms the advantageous effects of the present invention will be described using FIGS. 9 to 11.

Here, the amount of solder in the solder ball of the IC package formed a into an alloy and adhered to the contact pin after a high-temperature test was compared between a contact pin of Embodiment 2 of the present invention and a conventional contact pin. Here, the contact pin of Embodiment 2 of the present invention is provided with a contacting portion in which a second surface layer which was an Ag plated layer was laminated on the outer side of a first surface layer which was a Pd plated layer. On the other hand, the conventional contact pin is provided with a contacting portion including a surface layer which was a Pd—Ag alloy placed layer on the outer side of the contacting portion.

(1) Test Contents

A simultaneous high-temperature test was conducted using two types of IC sockets including a contact pin having the above-described configuration of Embodiment 2 (configuration in which the Ag plated second surface layer was laminated on the outer side of the Pd plated first surface) and one type of IC socket including a probe pin having a configuration in which a change was made in the contact pin from the lamination of the first surface layer and the second surface layer of the contacting portion to a single Pd—Ag alloy plated layer.

The specifications of the contact pins and the solder-plated leads of IC packages used in this test are as follows.

(2) Specifications of Two Types (Practical Examples) of Contact Pine Including Ag/Pd Plated Laminated Layer Both contact pins use Be—Cu for the base material thereof.

Both contact pins are formed into a blade spring-like shape including a plate-like contacting portion to have contact with a solder-plated lead.

The below-described laminated layers were formed on these contacting portions by wet plating.

That is, 2 to 3 μm-thick Ni plating was performed, and Au strike placing was performed so form an adhesion layer on the outer side of the Ni layer. For the first type of contact pin, there were laminated a 0.5 μm-thick first surface layer formed by Pd plating and a 0.3 μm-thick second surface layer formed by Ag plating. For the second type of contact pin, there were laminated a 0.5 μm-thick first surface layer formed by Pd plating and a 0.7 μm-thick second surface layer formed by Ag plating.

(3) Specifications of One Type (Conventional Example) of Contact Pin Including Ag—Pd Alloy Plated Layer The contact pin uses Be—Cu for the base material thereof.

The contact pin is formed into a blade spring-like shape including a plate-like contacting portion to have contact with a solder-plated lead.

The below-described layer was formed on this contacting portion by wet plating.

That is, 2 to 3 μm-thick Ni plating was performed, and Au strike plating was performed to form an adhesion layer on the outer side of the Ni layer. Subsequently, a 0.5 μm-thick Pd plated layer and a 0.5 μm-thick Ag plated layer were alternately laminated, and then Pd and Ag were thermally diffused at predetermined temperature in a thermostatic chamber to form an Ag—Pd alloy layer.

(4) Specifications of Solder-Plated Leads of IC Package

10 μm-thick pure Sn plated (5) Test Method

Method for measuring the amount of adhered solder: The Test was conducted using a laser microscope VP-9500 made by Keyence Corporation.

Test Conditions 1

Ambient temperature: Room temperature to 125° C.

Test time: 24 hours

Test Cycle 1 a. Attach the IC package to the IC socket.
b. Raise the temperature up to 125° C.
c. Keep the temperature at 125° C. for 24 hours.
d. Lower the temperature down to room temperature.
e. Detach the IC package from the IC socket.
f. Measure the amount of solder adhered to the contacting portion of the probe pin.

Test Conditions 2

Ambient temperature: Room temperature to 150° C.

Test time: 24 hours

Test Cycle 2 a. Attach the IC package to the IC socket.
b. Raise the temperature up to 150° C.
c. Keep the temperature at 150° C. for 24 hours.
d. Lower the temperature down to room temperature.
e. Detach the IC package from the IC socket.
f. Measure the amount of solder adhered to the contacting portion of the probe pin.

(6) Test Results

The above-described test was conducted to analyze the contacting portion of each contact pin.

Figure 9:
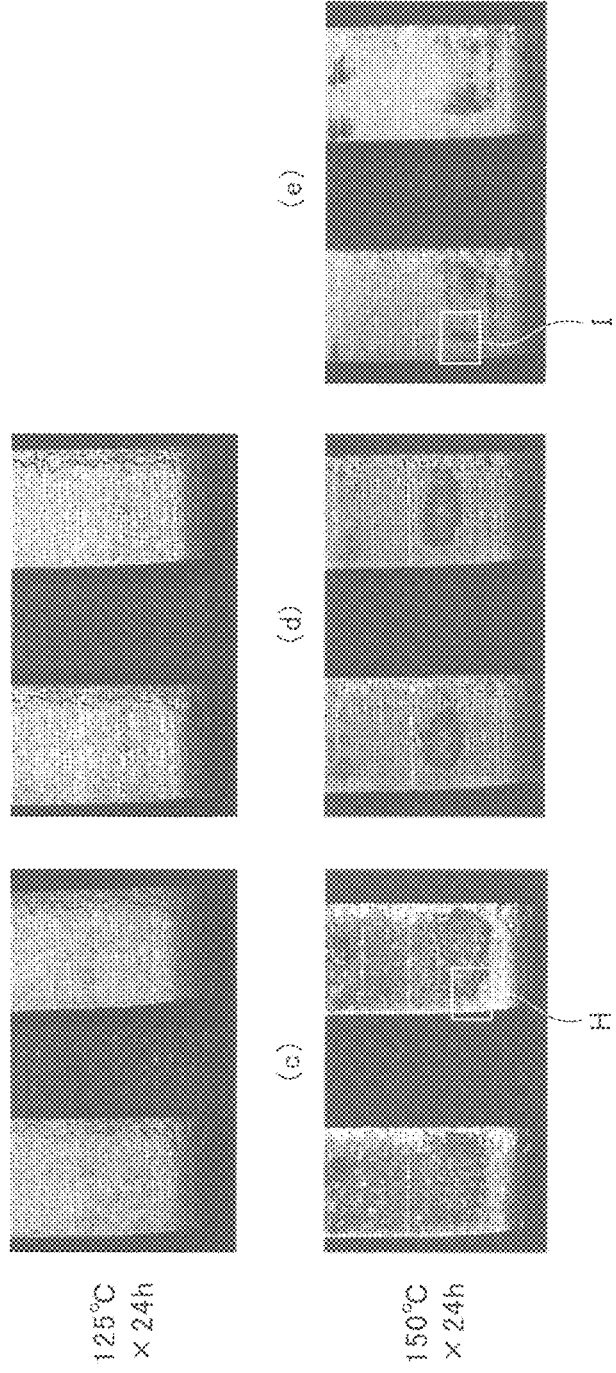
FIG. 9 is a plan view of a contact pin according to Embodiment 2 of the present invention, illustrating the results of a comparative experiment on solder sticking.

In the test conducted according to the test conditions 1 and the test cycle 1 (125° C.×24 hours), both the conventional contact pin including a Pd—Ag alloy plated layer and the contact pin of Embodiment 2 of the present invention including an Ag(0.3 μm)/Pd(0.5 μm) plated laminated layer showed almost no adhered solder and exhibited no differences, as illustrated in FIGS. 9(*a*) and 9(*b*).

In the test conducted according to the test conditions 2 and the test cycle 2 (110° C.×24 hours), there was obtained the result that the amount of adhered solder was large in the conventional contact pin including a Pd—Ag alloy plated layer, as observed in the H part of FIG. 9(*c*) and illustrated in FIGS. 10(*a*) to 10 (*c*) which are enlarged views of the H part, whereas the amount of adhered solder was small in the contact pin of Embodiment 2 of the present invention including an Ag(0.3 μm)/Pd(0.5 μm) plated laminated layer, as illustrated in FIG. 9(*d*). In addition, there was obtained the result that the amount of adhered solder in the contact pin of Embodiment 2 of the present invention including an Ag(0.7 μm)/Pd(0.5 μm) plated laminated layer was even smaller, as observed in the I part of FIG. 9(*e*) and illustrated in FIGS. 11(*a*) to 11(*c*) which are enlarged views of the I part.

From these results, there was drawn the conclusion that it could be said that in the contact pin of Embodiment 2 of the present invention including an Ag/Pd plated laminated layer, a solder-plated lead and the contact pin were less likely to stick to each other under the temperature condition of 150° C. or higher, when compared with the conventional contact pin including a Pd—Ag alloy plated layer.

Note that although the material of the contacting portion of each contact pin to have contact with a solder-plated lead has been discussed in this Embodiment 2, other locations of the contact pin may be formed from the same material.

In Embodiments 1 and 2 described above, a material the first and second layers of which constitute first and second surface layers as surface layers is used on the outer sides of a base material and a foundation layer as the material of probe and contact pins. The embodiments are not limited to this configuration, however. For example, the probe and contact pine may be composed of the material from which the first and second surface layers are formed on the outer side of the base material, without including the foundation layer, and the first and second surface layers may have each a configuration as described in Embodiments 1 and 2.

Embodiment 3 of Invention

FIG. 12 illustrates Embodiment 3 of the present invention. Note that Embodiment 3 of the present invention is the same as Embodiments 1 and 2 described above, except the constituent elements to be described hereinafter. Accordingly, constituent elements other than those different from the constituent elements of Embodiments 1 and 2 described above are denoted by like reference numerals and characters and will not be discussed again.

This Embodiment 3 uses a metal base material, rather than a surface layer, as the first layer of the present invention, and a surface layer is formed on a surface of the base material as a second layer.

Hereinafter, a fourth evaluation test that confirms the advantageous effects of the present invention will be described using FIG. 12.

Here, the amount of sharp-pointed edges of the substantially crown-shaped contacting portion of the second plunger of each probe pin that stuck to a solder ball of the IC package and became broken after a high-temperature test was compared between a probe pin of Embodiment 3 of the present invention and a conventional probe pin. As described above, the probe pin of Embodiment 3 of the present invention is provided with a second plunger in which a surface layer formed by Ag plating was laminated on the outer side of a base material formed from a Pd—Ag alloy. On the other hand, the conventional probe pin is provided with a second plunger composed of a Pd—Ag alloy base material alone.

(1) Test Contents

A simultaneous high-temperature test was conducted using an IC socket including a probe pin having the above-described configuration (configuration in which the Ag plated second layer (surface layer as referred to here) was laminated on the outer side of the Pd—Ag alloy first layer (base material as referred to here)) and an IC socket including a probe pin in which a change was made in the abovementioned probe pin so that the second plunger was configured to include a Pd—Ag alloy base material alone.

The specifications of the probe pins and the solder balls of IC packages used in this test are as follows.

(2) Specifications of Probe Pin (Practical Example) Including Ag/Pd—Ag Plated Laminated Layer The probe pin uses a Pd—Ag alloy for the base material thereof.

The contacting portion of the probe pin is formed into a substantially crown-like shape as the contacting portion 30a illustrated in FIG. 1.

The below-described laminated layer was formed on this contacting portion by wet plating.

That is, a 0.5 μm-thick surface layer was formed on the outer side of the base material by wet plating.

(3) Specifications of Probe Pin (Conventional Example) Including Pd—Ag Alloy Base Material Alone The probe pin uses a Pd—Ag alloy for the base material thereof.

The contacting portion of the probe pin is formed into a substantially crown-like shape as the contacting portion 30a illustrated in FIG. 1.

(4) Specifications of Solder Balls of IC Package
Sn-3Ag-0.5Cu (5) Test Method

Method for measuring the amount of adhered solder: The Test was conducted using a laser microscope PK-9500 made by Keyence Corporation.

Test Conditions

Ambient temperature: Room temperature to 125° C.

Test time: 24 hours

Test Cycle a. Attach the IC package to the IC socket.
b. Raise the temperature up to 125° C.
c. Keep the temperature at 125° C. for 24 hours.
d. Lower the temperature down to room temperature.
e. Detach the IC package from the IC socket.
f. Measure the amount of solder adhered to the contacting portion of the probe pin.

(6) Test Results

The above-described test was conducted to analyze the contacting portion of each probe pin.

There was obtained the result that the amount of breakdown in edges was large in the conventional probe pin including a Pd—Ag alloy base material alone, as shown in the in the D part of FIG. 12(a), whereas the amount of breakdown in edges was small in the probe pin of Embodiment 1 of the present invention having an Ag/Pd—Ag plated laminated structure, as shown in the E part of FIG. 12(b).

From this result, there was drawn the conclusion that it could be said that in the probe pin of Embodiment 3 of the present invention including an Ag/Pd—Ag plated laminated structure, a solder ball and the probe pin were less likely to stick to each other under the temperature condition of 125° C. lower than 150° C., when compared with the conventional probe pin including a Pd—Ag alloy base material alone.

Note that in Embodiments 1 to 3 described above, the second layer (second surface layer) is the outermost layer. The embodiments are not limited to this configuration, however. Alternatively, the embodiments may have a configuration in which a surface layer is further included on the outer side (surface side) of the second layer, as long as the configuration can maintain the advantageous effects of the present invention, including not disturbing the melting and diffusion of Sn at an adequate rate.

In addition, in Embodiments 1 to 3 described above, probe and contact pins serving as "electric contacts" are applied to an IC socket. Without limitation to this, however, these pins can also be applied to other components.

REFERENCE SIGNS LIST

1: Wiring board
1a: Electrode
2: IC package (electric part)
2a: Solder ball (terminal)
10: IC socket (socket for electric parts)
13: Socket body
14: Probe pin (electric contact)
15: Floating plate (housing portion)
20: First plunger
30: Second plunger
30a: Contacting portion 31: Base material
32: Foundation layer
33: First surface layer (first layer)
34: Second surface layer (second layer)
40: Cylindrical member
50: Coil spring

The invention claimed is:

1. An electric contact used to conduct a continuity test in a high temperature environment by being brought into contact with an Sn-containing terminal of an electric part, the electric contact comprising:
   a first layer having a first Sn-diffusion rate into which Sn is to melt and diffuse at the first Sn-diffusion rate, while the electric contact is brought into contact with the Sn-containing terminal of the electric part to conduct the continuity test of the electric part upon application of heat in a high temperature range of about 125° C. to about 180° C.; and
   a second layer having a second Sn-diffusion rate formed on an outer side of the first layer, into which the Sn melts and diffuses at the second Sn-diffusion rate lower than the first Sn-diffusion rate of the first layer, upon application of the heat of the continuity test while the second layer is brought into contact with the Sn-containing terminal of the electric part,
   wherein
      a thickness of the first layer is within a range of 0.2 μm to about 5 μm so that the Sn melts and diffuses into the first layer at the first Sn-diffusion rate,
      the first layer is a Pd layer or a Pd alloy layer, and
      the second layer is an Ag alloy layer composed primarily of Ag and containing Au or Cu in addition to the Ag, to provide a weight ratio of the Au or Cu being lower than the Ag so that the Sn melts and diffuses into the second layer at the second Sn-diffusion rate lower than the first Sn-diffusion rate of the first layer to retard Sn diffusion into the first layer.

2. The electric contact according to claim 1, further comprising a base material having electrical conductivity and a foundation layer formed on an outer side of the base material and composed primarily of Ni,
   wherein
      the first layer is formed on an outer side of the foundation layer, and
      the second layer is formed on the outer side of the first layer.

3. The electric contact according to claim 1, comprising a base material serving as the first layer,
   wherein the second layer is formed on an outer side of the base material.

4. A socket for electric parts used to conduct a continuity test in a high temperature environment, comprising:
   a socket body;
   a housing portion in which an electric part provided with an Sn-containing terminal is housed; and
   an electric contact disposed in the socket body and placed in contact with the Sn-containing terminal,
   wherein
      a first layer having a first Sn-diffusion rate into which Sn melts and diffuses at the first Sn-diffusion rate upon application of heat and a second layer having a second Sn-diffusion rate formed on an outer side of the first layer are formed on a surface of the electric contact, into which the Sn melts and diffuses at the second Sn-diffusion rate lower than the first Sn-diffusion rate of the first layer upon application of heat of the continuity test when the electric contact is brought into contact with the Sn-containing terminal of the electric part and the continuity test of the electric part is conducted in a high temperature range of about 125° C. to about 180° C.,
      a thickness of the first layer is within a range of 0.2 μm to about 5 μm so that the Sn melts and diffuses into the first layer at the first Sn-diffusion rate,
      the first layer is a Pd layer or a Pd alloy layer, and
      the second layer is an Ag alloy layer composed primarily of Ag and containing Au or Cu in addition to Ag, a weight ratio of the Au or Cu is lower than that of the Ag so that the Sn melts and diffuses into the second layer at the second Sn-diffusion rate lower than the first Sn-diffusion rate of the first layer to retard Sn diffusion into the first layer.

5. An electric contact used to conduct a continuity test in a high temperature environment by being brought into contact with an Sn-containing terminal of an electric part, the electric contact comprising:
   a first layer having a first Sn-diffusion rate into which Sn is to melt and diffuse at the first Sn-diffusion rate, while the electric contact is brought into contact with the Sn-containing terminal of the electric part to conduct the continuity test of the electric part upon application of heat in a high temperature range of about 125° C. to about 180° C.; and
   a second layer having a second Sn-diffusion rate formed on an outer side of the first layer, into which the Sn melts and diffuses at a second diffusion rate lower than the first diffusion rate of the first layer upon application of the heat of the continuity test while the second layer is brought into contact with the Sn-containing terminal of the electric part,
   wherein
      a thickness of the first layer is within a range of 0.2 μm to about 5 μm so that the Sn melts and diffuses into the first layer at the first Sn-diffusion rate,
      the first layer is a Pd alloy layer composed primarily of Pd and containing Cu in addition to the Pd, to provide a weight ratio of Cu being lower than the Pd, and
      the second layer is an Ag layer or an Ag alloy layer so that the Sn melts and diffuses into the second layer at the second Sn-diffusion rate lower than the first Sn-diffusion rate of the first layer to retard Sn diffusion into the first layer.

6. The electric contact according to claim 5, further comprising a base material having electrical conductivity and a foundation layer formed on an outer side of the base material and composed primarily of Ni,
   wherein the first layer is formed on an outer side of the foundation layer, and the second layer is formed on the outer side of the first layer.

7. The electric contact according to claim 5, comprising a base material serving as the first layer, wherein the second layer is formed on an outer side of the base material.

8. A socket for electric parts used to conduct a continuity test in a high temperature environment, comprising:
   a socket body;
   a housing portion in which an electric part provided with an Sn-containing terminal is housed; and
   an electric contact disposed in the socket body and placed in contact with the Sn-containing terminal,
   wherein
      a first layer having a first Sn-diffusion rate into which Sn melts and diffuses at the first Sn-diffusion rate upon application of heat and a second layer having a second Sn-diffusion rate formed on an outer side of the first layer are formed on a surface of the electric contact, into which the Sn melts and diffuses at the second Sn-diffusion rate lower than the first Sn-diffusion rate of the first layer upon application of heat of the continuity test when the electric contact is brought into contact with the Sn-containing terminal of the electric part and the continuity test of the electric part is conducted in a high temperature range of about 125° C. to about 180° C., a thickness of the first layer is within a range of 0.2 μm to about 5 μm so that the Sn melts and diffuses into the first layer at the first Sn-diffusion rate, the first layer is a Pd alloy layer composed primarily of Pd and containing Cu in addition to Pd, a weight ratio of Cu is lower than the Pd, and the second layer is an Ag layer or an Ag alloy layer so that the Sn melts and diffuses into the second layer at the second Sn-diffusion rate lower than the first Sn-diffusion rate of the first layer to retard Sn diffusion into the first layer.

9. An electric contact used to conduct a continuity test in a high temperature environment by being brought into contact with an Sn-containing terminal of an electric part, the electric contact comprising:

a first layer having a first Sn-diffusion rate into which Sn melts and diffuses at the first Sn-diffusion rate upon application of heat when the electric contact is brought into contact with the Sn-containing terminal of the electric part and the continuity test of the electric part is conducted in a high temperature range of about 125° C. to about 180° C.; and a second layer having a second Sn-diffusion rate formed on an outer side of the first layer, into which the Sn melts and diffuses at the second Sn-diffusion rate lower than the first diffusion rate of the first layer upon application of heat of the continuity test, wherein a thickness of the first layer is within a range of 0.2 μm to about 5 μm so that the Sn melts and diffuses into the first layer at the first Sn-diffusion rate, the first layer is an Pd alloy plated layer composed primarily of Pd and containing Ag, Au, Cu or Sn in addition to Pd, a weight ratio of Ag, Au, Cu or Sn is lower than the Pd, and the second layer is an Ag alloy plated layer composed primarily of Ag and containing Au, Cu, Pd or Sn in addition to Ag, a weight ratio of the Au, Cu, Pd or Sn is lower than that of the Ag so that the Sn melts and diffuses into the second layer at the second Sn-diffusion rate lower than the first Sn-diffusion rate of the first layer to retard Sn diffusion into the first layer.

10. The electric contact according to claim 9, further comprising a base material having electrical conductivity and a foundation layer formed on an outer side of the base material and composed primarily of Ni, wherein the first layer is formed on an outer side of the foundation layer, and the second layer is formed on the outer side of the first layer.

11. The electric contact according to claim 9, comprising a base material serving as the first layer, wherein the second layer is formed on an outer side of the base material.

12. A socket for electric parts used to conduct a continuity test in a high temperature environment, comprising:

a socket body;

a housing portion in which an electric part provided with an Sn-containing terminal is housed; and an electric contact disposed in the socket body and placed in contact with the Sn-containing terminal, wherein a first layer having a first Sn-diffusion rate into which Sn melts and diffuses at the first Sn-diffusion rate upon application of heat and a second layer having a second Sn-diffusion rate formed on an outer side of the first layer are formed on a surface of the electric contact, into which the Sn melts and diffuses at the second Sn-diffusion rate lower than the first Sn-diffusion rate of the first layer upon application of heat of the continuity test when the electric contact is brought into contact with the Sn-containing terminal of the electric part and the continuity test of the electric part is conducted in a high temperature range of about 125° C. to about 180° C., a thickness of the first layer is within a range of 0.2 μm to about 5 μm so that the Sn melts and diffuses into the first layer at the first Sn-diffusion rate, the first layer is an Pd alloy plated layer composed primarily of Pd and containing Ag, Au, Cu or Sn in addition to Pd, a weight ratio of Ag, Au, Cu or Sn is lower than the Pd, and the second layer is an Ag alloy plated layer composed primarily of Ag and containing Au, Cu, Pd or Sn in addition to Ag, a weight ratio of the Au, Cu, Pd or Sn is lower than that of the Ag so that the Sn melts and diffuses into the second layer at the second Sn-diffusion rate lower than the first Sn-diffusion rate of the first layer to retard Sn diffusion into the first layer.

* * * * *